United States Patent [19]

Hermann

[11] Patent Number: 4,611,169
[45] Date of Patent: Sep. 9, 1986

[54] SENSOR FOR MEASURING RELATIVE MOVEMENT BETWEEN A VEHICLE AND A TRACK BY SENSING MAGNETIC FIELD DISTORTIONS

[75] Inventor: Walter Hermann, Baldham, Fed. Rep. of Germany

[73] Assignee: Messerschmitt-Boelkow-Blohm Gesellschaft mit beschraenkter Haftung, Munich, Fed. Rep. of Germany

[21] Appl. No.: 544,859

[22] Filed: Oct. 24, 1983

[30] Foreign Application Priority Data

Nov. 2, 1982 [DE] Fed. Rep. of Germany ....... 3240478

[51] Int. Cl.$^4$ .............................................. G01B 7/14
[52] U.S. Cl. .................................... 324/208; 104/284
[58] Field of Search ............... 324/207, 208, 239, 243, 324/163, 166; 104/284; 340/870.31, 870.32

[56] References Cited

U.S. PATENT DOCUMENTS 3,439,256 4/1969 Kähne ................................. 324/208
4,066,962 1/1978 Jaffe ................................... 324/208

FOREIGN PATENT DOCUMENTS 0120457 10/1978 Japan .................................. 324/207

OTHER PUBLICATIONS

Elektrotechnische Zeitschrift-A, Bd. 83, pp. 367–372, (article by Hans Joachim Lippmann) title: "Kontaktloser Signalgeber mit Beruehrungsloser Betaetigung Durch Eisenteile".

Primary Examiner—Ernest F. Karlsen
Assistant Examiner—Walter E. Snow
Attorney, Agent, or Firm—W. G. Fasse; D. H. Kane, Jr.

[57] ABSTRACT

Magnetic field distortions are sensed by a magnetic sensor including a magnetic field sensor or receiver arranged for cooperation with a magnetic transmitter which generates the magnetic field for providing measured values representing such distortions. The magnetic receiver has a preferred directional axis in which the receiver is sensitive. The receiver is so arranged or located that the undistorted magnetic field lines of the magnetic field produced by the magnetic transmitter extend approximately perpendicularly to the preferred directional axis of the magnetic receiver. By locating the receiver in this specific position it is possible to substantially increase the sensitivity of such sensors and hence their sensing range for example in measuring the spacing between a magnetically levitated vehicle and a rail surface relative to which the vehicle is travelling.

11 Claims, 8 Drawing Figures

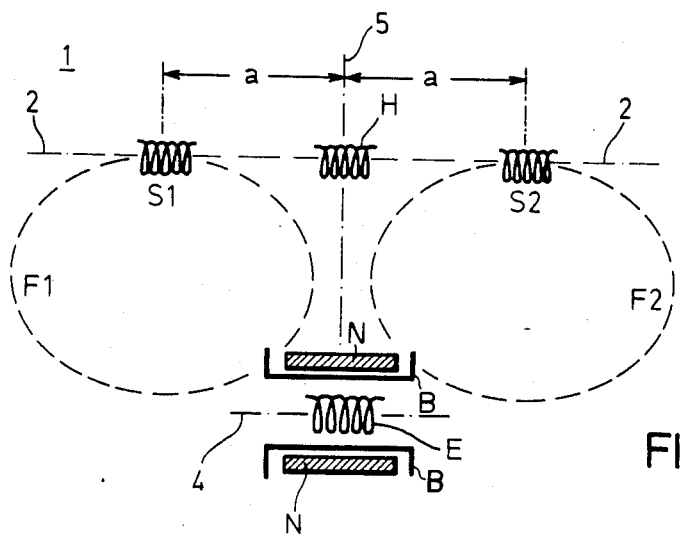
FIG. 4
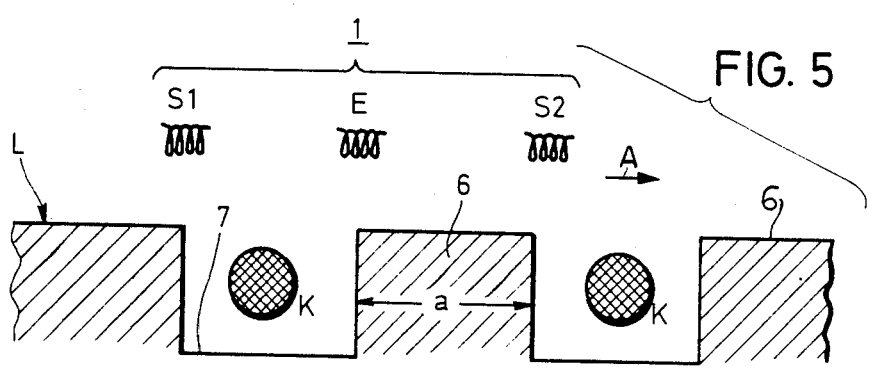
FIG. 5
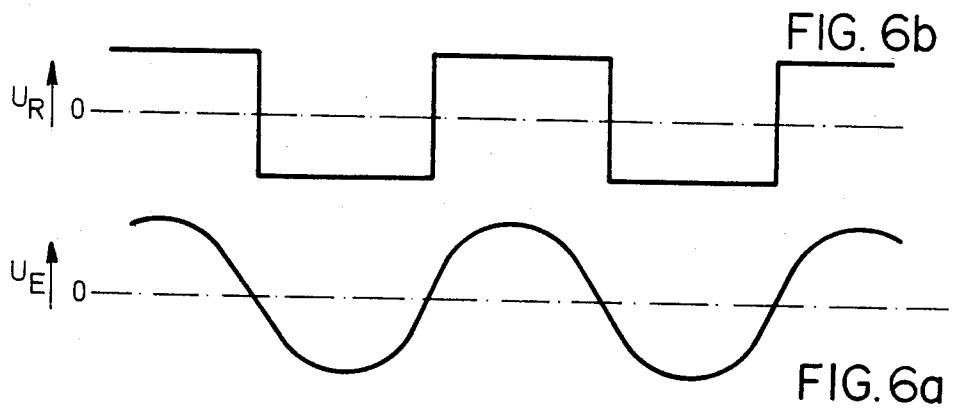
FIG. 6b
FIG. 6a

SENSOR FOR MEASURING RELATIVE MOVEMENT BETWEEN A VEHICLE AND A TRACK BY SENSING MAGNETIC FIELD DISTORTIONS

FIELD OF THE INVENTION

The invention relates to a sensor for sensing magnetic field distortions caused by disturbances, or rather disturbing bodies entering into the magnetic field. More specifically, the invention relates to a sensor for ascertaining measured values representing such magnetic field disturbances. Such sensors include a device for generating the magnetic field herein referred to as the transmitter and a device for detecting the magnetic field herein referred to as the receiver which is sensitive in the direction of a main or preferred axis.

DESCRIPTION OF THE PRIOR ART

The magnetic field generator or transmitter comprises conventionally one or several permanent magnets or a magnetic coil through which an alternating current flows. The magnetic field detector or receiver comprises, for example, in connection with sensing unidirectional magnetic fields, a so-called magnetometer, for example in the form of a Hall sensor or the like or it comprises one or several induction coils when alternating magnetic fields are to be sensed. Such conventional magnetic sensors react to or sense the magnetic field in the direction of a preferred axis. In connection with induction coil sensors or receivers the preferred axis is the main coil axis.

It is possible to ascertain distortions of the magnetic field with the aid of such receivers or sensors. Such distortions occur, when an electrically or magnetically conducting body penetrates into the undisturbed magnetic field in which the sensor is located. Bodies which are good electrical conductors localize the magnetic field of the transmitter due to the eddy currents produced in such bodies, whereby the magnetic field distribution in the remaining space outside the disturbing body is also changed. Bodies made of materials which are good magnetic conductors modify the magnetic field of the sensor due to the low magnetic resistance relative to the magnetic resistance outside such bodies of magnetically well conducting materials. This is so even if the generation of eddy currents in the case of alternating magnetic fields is substantially reduced in a known manner, for example by using laminated sheet metal packets or by making these bodies of iron powder or ferrite.

Such sensors or receivers are conventionally used in the near zone around the transmitter, generally in a measuring range of a few centimeters. Such devices are used, for example, for measuring the distance travelled and thus the speed which may be ascertained from the distance travelled by a magnetically levitated vehicle. Such a magnetically levitated vehicle driven by a synchroneous linear motor travels along a rail line without contacting the rail line which is equipped with an elongated stator provided with grooves or teeth at uniform short spacings of a few centimeters. The sensor in such a vehicle comprises an elongated high frequency transmitter coil of a length of about 10 cm and two shorter receiver coils, one of which is arranged on each side of the transmitter coil. All coils are located in the same plane and the coil axes extend in parallel to one another. As the magnetically levitated vehicle travels along the rail line this coil arrangement is guided with its plane in parallel to the surface of the elongated stator whereby the magnetic field generated by the transmitter coil is disturbed by the alternating grooves or teeth of the elongated stator, thereby causing distortions in the magnetic field. As a result, the magnetic flow through the respective receiver coils is correspondingly influenced. The output signal of the sensor is the result of the difference of the two output voltages of the two receiver coils.

Such a conventional sensor can sense or process magnetic field variations only when the spacing between the magnetic sensor and the elongated stator is not larger than about 45 mm. Stated differently, the stator is the body which disturbs the magnetic field of the transmitter coil and the spacing of not more than 45 mm is possible only if the groove or tooth width is 43 mm. If the spacing between the coil plane and the elongated stator surface is larger than this value, then the receiver voltages at the output of the two receiver coils are equal to each other and the resulting output signal is zero. When the vehicle travels over the grooves and teeth of the longitudinal stator with a smaller spacing, the magnetic alternating field lines of the transmitter coil are distorted by the grooves and teeth of the elongated stator so that the difference of the two receiver voltages differs from zero. If the respective spacings between the transmitter coils and receiver coils are properly selected, it is possible to allocate to each zero transition of this difference voltage a respective transition between a groove and a tooth or between a tooth and a groove.

In this prior art sensor additional small variations of the difference voltage overlap the zero transitions between a tooth and a groove or a groove and a tooth if the spacings are above about 45 mm. Such additional smaller variations in the difference voltage may, for example, be caused by inhomogeneities in the elongated stator assembled to form a laminated sheet metal package.

Similar considerations apply in the case where it is intended to use such a sensor for measuring the spacing or the change in the spacing between the coil plane and a reference surface, for example, the rail surface.

OBJECTS OF THE INVENTION

In view of the above it is the aim of the invention to achieve the following objects singly or in combination:

to produce a magnetic sensor of the type described above capable of measuring smaller magnetic field distortions than was possible heretofore so that, for example, larger spacings may be accommodated;

to protect such a magnetic sensor against disturbing influences;

to specifically adapt such a sensor for a rapidly moving magnetically elevated vehicle so that magnetic field disturbances occurring at a spacing of about 75 mm can be sensed without any problems;

to improve the sensitivity of such sensors while keeping their structure simple so that magnetic field distortions may be precisely ascertained without the influence of disturbances such as inhomogeneities in the elongated stator;

to place the magnetic sensor in a location where a polarity jump occurs and which may be used for unidirectional magnetic field sensing as well as for alternating magnetic field sensing; and to provide a magnetic sensor for measuring the spacing between a plane in which the magnetic coils are arranged and a surface of an electrically and magnetically conducting member forming a measuring or reference plane, for example, the surface of the rail of a magnetically levitated vehicle and to also measure the distance travelled by such a vehicle and the speed at which the vehicle is travelling.

SUMMARY OF THE INVENTION

According to the invention the receiver is arranged in the magnetic field of the transmitter in such a position that the preferred sensing axis of the receiver extends approximately perpendicularly to the magnetic field lines of the undisturbed magnetic field generated by the transmitter. Thus, the sensor in the form of an induction coil is arranged in the magnetic field of the transmitter in the form of one or several transmitter coils, whereby the preferred sensing axis of the receiver coil extends perpendicularly or approximately perpendicularly to the undisturbed magnetic field lines. As long as the magnetic field is undisturbed, the output signal of the receiver or receiver coil, is substantially zero.

The selection of the specific locations of the receiver within the magnetic field of the transmitter is based on the following considerations. If the receiver is displaced out of the location taught by the invention in a predetermined direction, the receiver, for example, an induction coil, would detect a positive receiver voltage. If the receiver is displaced in the opposite direction, the received signal has the opposite polarity, namely, a negative receiver output voltage. At a point between these two displacement directions, the receiver signal or rather, the receiver output voltage, changes the polarity. Accordingly, the invention teaches to place the receiver as close as possible to the location where this jump in the polarity of the output signal takes place. It has been found that this is the case if the main sensing axis of the receiver extends approximately perpendicularly to the magnetic field lines of the magnetic field generated by the transmitter.

The just mentioned displacement of the receiver or of the receiver coil may be equated to a disturbance of the magnetic field, for example, by a body made of a material which is a good electrical or magnetic conductor. As a result, if the receiver is located as taught by the invention, such disturbances cause magnetic field distortions or variations at the receiver locations and these distortions or variations in turn cause, even if they are small, substantial relative changes of the received signal at the location of the receiver and in its vicinity. This effect is substantially stronger than in conventional sensors. Accordingly, in this manner it becomes possible to sense magnetic field variations or a measured value derivable from these variations at substantially larger distances than could be measured heretofore.

A sensor according to the invention for sensing magnetic field variations may be used in connection with unidirectional magnetic fields as well as with alternating magnetic fields. For measuring in the near range it is suggested to use as the transmitter high frequency energized coils and as the receiver also an induction coil. Such coils have the advantage that they are substantially unaffected by disturbances. In the simplest embodiment the sensor according to the invention comprises a single high frequency transmitter coil and a single receiver coil which is so arranged in the magnetic field of the transmitter coil that the magnetic field lines extend approximately perpendicularly to the coil axis of the receiver coil.

Depending on the particular type of application, it is possible to use several transmitter coils, for example, two high frequency transmitter coils may be arranged so that they have substantially a common axis, whereby the receiver coil is arranged in the symmetry plane of the transmitter coil. The symmetry plane extends intermediate the two transmitter coils which are arranged mirror-symmetrically relative to the symmetry plane so that the coil axis of the transmitter coils extend perpendicularly to the symmetry plane. This particular sensor embodiment can be extended to have four transmitter coils and one receiver coil. In that embodiment all four transmitter coils are, for example, arranged in the same plane with the receiver coil.

Depending on the type of application, the magnetic fields of all transmitter coils are either added or substracted in the receiver coil.

By arranging the four transmitter coils approximately in a common plane, it is possible to reduce the influences that may be caused by coil displacements relative to one another, for example, due to temperature variations or due to a slanted instantaneous position of the coil plane relative to a surface to be measured and made of a material which is a good electrical or magnetic conductor such as the rail surface of a rail line for a magnetically levitated vehicle.

As is customary in such coil arrangements it is possible to exchange a transmitter coil for a receiver coil and vice versa. Further, in order to fully utilize the range in which the present sensors are capable of sensing, it is suggested that the spacing between the transmitter and the receiver is selected to be within the range of the maximum distance to which a magnetic field variation is to be sensed.

A sensor according to the invention may advantageously be used for two purposes in connection with magnetically levitated vehicles, namely, for measuring the spacing or gap between a plane in which the coil arrangement is located on the magnetically levitated vehicle and a reference plane of a body made of a material that is a good electrical or magnetic conductor, for example, the rail surface on which the magnetically levitated vehicle is travelling. Further, the present system is advantageously employed for measuring the distance travelled by a magnetically levitated vehicle along the grooves and teeth of the elongated stator. For both purposes it is possible to use coil arrangements having two transmitter coils equally spaced from a plane of symmetry with the receiver coil arranged in such plane of symmetry. For measuring the spacing between the rail surface and the magnetically levitated vehicle, the magnetic fluxes of the two transmitter coils are added in the receiver coil. For measuring the distance travelled, the magnetic fluxes in the two transmitter coils are subtracted in the receiver coil. In the latter instance, one obtains defined zero transitions in the output voltage of the receiver coil which corresponds to the transitions of a groove to a tooth and from a tooth to a groove. The number of these transitions provide an indication of the distance travelled because the width of the grooves and the width of the teeth is the same and a value of known length. Thus, the distance travelled may be ascertained by multiplying this constant length with the number of transitions and the travelling speed may be ascertained by differentiating the distance travelled.

Preferably, the magnetic transmitter coils are energized with high frequency energy which, depending on the particular type of application, may have a frequency up to several MHz. The energizing frequency will be selected to be substantially higher than the frequency of any disturbances that might be encountered. Thus, such disturbances may be effectively reduced by means of a magnetic shunt, for example, in the form of a laminated sheet metal packet or in the form of a ferrite body in combination with sheet metal shielding which is uneffective relative to the high operational frequency for energizing the transmitter coils. It has been found that the effectiveness of such disturbances can be reduced by a factor of about 3 by the just described means.

BRIEF FIGURE DESCRIPTION

In order that the invention may be clearly understood, it will now be described, by way of example, with reference to the accompanying drawings, wherein:

FIG. 4 is a view similar to that of FIG. 2a as far as the coil arrangement is concerned and further showing an auxiliary transmitter coil and the magnetic shielding and shunting means for the receiver coil;

FIG. 5 shows schematically the location of the sensor according to FIG. 4 relative to an elongated stator along a rail line on which a magnetically levitated vehicle carrying such a sensor is travelling;

FIG. 6a illustrates the sinesoidal output voltage of the receiver coil of FIG. 5; and FIG. 6b shows a square waveform produced from the output voltage of FIG. 6a.

DETAILED DESCRIPTION OF PREFERRED EXAMPLE EMBODIMENTS AND OF THE BEST MODE OF THE INVENTION

Figure 1:
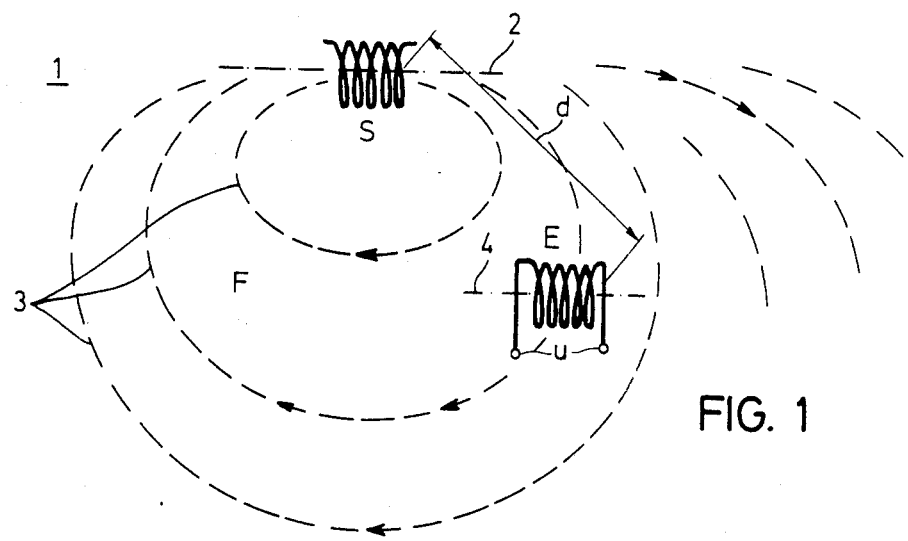
FIG. 1 illustrates schematically a sensor according to the invention comprising one transmitter coil and one receiver coil arranged as taught herein.

FIG. 1 illustrates the simplest embodiment of a sensor according to the invention for sensing variations or fluctuations in a magnetic field for deriving a measuring value. The sensor 1 comprises a single transmitter coil S having a plurality of windings and a main coil axis 2 extending centrally through the coil S. The source of alternating current for energizing the coil S is not shown, however, the frequency of the alternating current or voltage will depend on the particular type of application and may be as high as several MHz, whereby the particular frequency is freely selectable for the respective purpose. The transmitter coil S generates a spacial magnetic field F having magnetic field lines 3 as schematically shown in FIG. 1. The polarity of the individual field lines is indicated by the direction of the arrows.

The sensor 1 further comprises a receiver coil E also comprising several windings and having a coil axis 4 which is the preferred axis. The spacing d between the transmitter coil S and the receiver coil E is selected to correspond to the maximum distance to a body which may cause a distortion of the magnetic field lines 3. According to the invention the receiver coil E is so oriented relative to the magnetic field F, that the field lines 3 extend approximately perpendicularly to the preferred axis 4 of the receiver coil E at the location where the receiver coil E is located.

The receiver coil E has output terminals producing an output voltage u when the field lines are distorted. As long as the field lines are not distorted as shown in FIG. 1, the output voltage u equals 0. In FIG. 1 the axes 2 and 4 extend in parallel to each other. However, a different orientation of these axes relative to each other is also possible as long as the direction of the field lines is approximately perpendicular to the direction of the preferred axis 4 of the receiver coil E.

If now a body made of a material which is a good electrical or magnetic conductor disturbs the field lines 3 to thereby cause a field distortion, the geometric relationship between the axis 4 and the field line 3 is also distorted, whereby the field lines will have components at the location of the receiver coil E which extend in the direction of the coil axis 4. As a result, a received voltage u will be measured at the output terminals of the coil E. The polarity of the output voltage u will depend on the type of the field distortion. Even small distortions of the magnetic field F of the transmitter coil S cause large relative changes in the receiver output voltage u.

The relative fluctuations or changes of the receiver output signal u are the larger the closer the receiver coil is located to the point of the phase jump when the magnetic field F of the transmitter coil S is not disturbed. In this connection it is necessary to make a compromise between the relative change and the disturbance spacing d which is selected as mentioned above, because the absolute value of the receiver output voltage u becomes smaller and smaller the more the receiver coil E is away from the point of the phase jump or polarity change and the ever smaller output value becomes more and more susceptible to interferences.

Figure 2A:
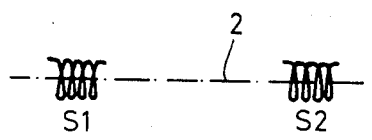
FIG. 2a is a schematic illustration of a sensor with two transmitter coils and one receiver coil.

FIG. 2a illustrates a sensor with two transmitter coils S1 and S2 having a common coil axis 2 cooperating with a single receiver coil E having its axis 4 extending in parallel to the common axis 2 of the two transmitter coils S1 and S2.

Figure 2B:
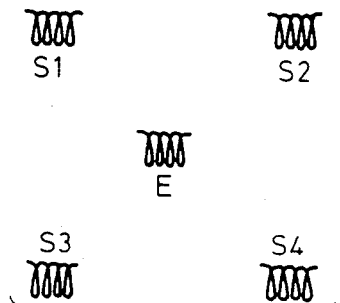
FIG. 2b is a sensor with four transmitter coils and one receiver coil.

FIG. 2b illustrates a sensor with four transmitter coils S1, S2, S3, and S4 cooperating with a single receiver coil E. In both FIGS. 2a and 2b all coil axes extend in the same plane. In FIG. 2b the transmitter coils S1 and S2 have a common coil axis and the transmitter coils S3 and S4 also have a common coil axis.

The just mentioned coil arrangements do not necessarily require the location of the respective coil axis in the same plane. The arrangements of the coils in a common plane has been selected in order to measure magnetic field fluctuations which are caused by a reference plane extending in parallel to the plane defined by the coil axes. This will be described in more detail below. However, it is necessary for all coil arrangements as just described, that the magnetic field lines extend approximately perpendicularly to the preferred axis of the receiver coil E at the location of the receiver coil and when the magnetic field lines are not disturbed so that when a disturbance and resulting field line distortion takes place at the location of the receiver coil E a strong relative change in the receiver output voltage u will result.

Figure 3:
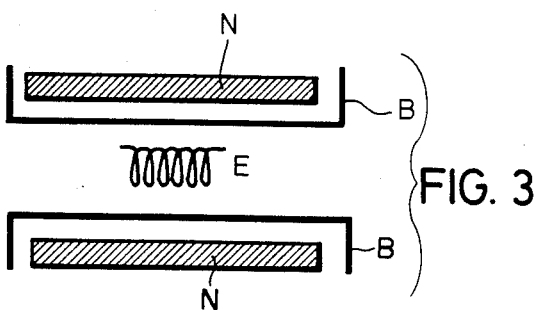
FIG. 3 illustrates schematically a receiver coil with magnetic shunts and sheet metal shielding for the receiver coil for a sensor according to the invention.

In the sensors described so far the output voltage u may be impaired by interfering magnetic fields. Such interfering magnetic fields generally have a lower frequency than the frequency of the magnetic field generated by the transmitter coil or coils. As shown in FIG. 3, such interfering magnetic fields, or rather their influences can be minimized by providing the receiver coil E with a magnetic shunt body N, for example, in the form of a laminated sheet metal packet or in the form of a ferrite body and by further providing between the magnetic shunt N and the receiver coil E sheet metal shielding B. The thickness of the sheet metal for the shielding B will be determined by taking into account the following considerations. On the one hand, the thickness of the sheet metal shielding B must be such that the penetration depth of the magnetic field lines 3 generated by the transmitter coils at the high frequency is very small relative to the sheet metal thickness. Stated differently, the shielding B must keep the magnetic field lines generated at the high frequency for the sensing purpose away from the magnetic shunts N. On the other hand, the magnetic penetration depth of interfering field lines at lower frequencies must be very large relative to the sheet metal thickness of the shielding B so that the interfering magnetic fields penetrate through the shielding substantially undiminished so that these interfering field lines reach the magnetic shunts N.

FIG. 4 shows a sensor 1 for measuring the distance s and the speed v of a magnetically levitated vehicle. The sensor is substantially constructed as that shown in FIG. 2a. Thus, the sensor 1 comprises again two transmitter coils S1 and S2 having a common coil axis 2 and uniformly spaced at a spacing "a" from a common plane 5 of symmetry. The coils S1 and S2 are energized by a high frequency source not shown. However, the coils S1 and S2 are so poled that the magnetic fields are superimposed in opposite sense in the zone of the plane 5 of symmetry. The receiver coil E is provided with a shielding comprising a magnetic shunt N and shielding sheet metals B as disclosed in FIG. 3. The mirror or plane of symmetry 5 is so arranged that the coil axis 4 of the receiver coil E extends approximately perpendicularly to the magnetic field lines.

The operation of the present sensors will now be described with reference to FIG. 5, wherein the sensor 1 again has two transmitter coils S1 and S2 and a receiver coil E arranged in a common plane. The sensor 1 is attached to a magnetically levitated vehicle not shown, but driven by a synchronous linear motor, the elongated stator L of which is installed along the rail line. The stator L is provided with grooves 7 and teeth 6. The teeth and grooves have approximately the same width "a". The stator cable K extends in the grooves 7. The magnetically levitated vehicle travels in the direction of the arrow A. The coils S1, S2 and E of the sensor 1 are located, as mentioned, in a common plane which in turn extends in parallel to the surface of the elongated stator L. Further, the spacing horizontally between the receiver coil E and the transmitter coil S1 and between the receiver coil E and the transmitter coil S2 also correspond to the width "a" so that if one coil is located in register with a transition between a groove or tooth or between a tooth and a groove, the other coils are also located in register with such a transition as shown in FIG. 5.

As shown in FIG. 6a, when the vehicle travels in the direction of the arrow A, the receiver coil E produces a sinesoidal output voltage $U_E$ with the zero transitions in register with the respective tooth/groove or groove/tooth transition. Conventional means may be used for shaping the sinesoidal wave form of FIG. 6a into a square wave voltage $U_R$ as shown in FIG. 6b. By counting the zero transitions, the distance travelled by the magnetically levitated vehicle may be ascertained since the spacing "a" is known. Similarly, by differentiating the distance relative to time, the vehicle's speed may be ascertained.

Incidentally, referring again to FIG. 4, an auxiliary coil H is located in the plane of symmetry 5 between the two transmitter coils S1 and S2 for the purpose of providing a fine tuning of the coil arrangement. Stated differently, with the aid of the auxiliary coil H it is possible to adjust the output voltage u of the receiver coil E to zero when the magnetic fields F1 and F2 are undisturbed. A rough adjustment or tuning may be performed as a preliminary operation to the fine tuning, by mechanically adjusting the position of the transmitter coils S1 and S2.

As described above, the system was explained with reference to alternating magnetic fields. However, as mentioned, the present sensor is also suitable for unidirectional magnetic fields. However, in that instance the magnetic field can be influenced only by bodies made of material constituting a good magnetic conductor since there is no shielding effect in connection with unidirectional magnetic fields as it exists in connection with alternating magnetic fields where the eddy currents may be used for the shielding.

Although the invention has been described with reference to specific example embodiments, it will be appreciated, that it is intended, to cover all modifications and equivalents within the scope of the appended claims.

What is claimed is:

1. An apparatus for measuring a relative movement between a magnetically levitated vehicle and a track on which said vehicle can travel, by sensing distortions in a magnetic field to produce measured values representing said relative movement comprising a rail (4) of magnetically conducting material with uniformly spaced teeth in said rail forming part of said track, magnetic sensor means carried by said vehicle, said sensor means comprising magnetic transmitter means including at least one alternating current energized transmitter coil for generating a magnetic field having normally undisturbed field line extending in a given direction, magnetic receiver means including at least one receiver coil for sensing said distortions, said magnetic receiver coil and said magnetic transmitter coil each having a respective preferred coil axis, said magnetic receiver coil being located in such a position in said generated magnetic field that said preferred axis of said magnetic receiver coil extends approximately perpendicularly to said undisturbed field lines, said coil axes being spaced from each other by a predetermined spacing, said coil axes being located in a common plane parallel to said rail for measuring said relative movement.

2. The apparatus of claim 1, wherein said predetermined spacing corresponds approximately to the maximum distance between the magnetic transmitter coil and said rail (L) which causes said magnetic field distortion.

3. The apparatus of claim 1, wherein said alternating current for energizing said magnetic transmitter coil has a high frequency.

4. The apparatus of claim 1, wherein said magnetic transmitter means comprise two transmitter coils both of which are energizable in the same manner by high frequency energy, each of said two transmitter coils having a transmitter coil main axis arranged so as to extend approximately in alignment with the other transmitter coil main axis, said magnetic receiver coil being arranged in a plane of symmetry extending centrally between the two transmitter coils so that the two transmitter coils are located mirror-symmetrically relative to said plane of symmetry, said receiver coil having said preferred axis extending substantially perpendicularly to said plane of symmetry.

5. The apparatus of claim 1, further comprising auxiliary means for generating an auxiliary magnetic field for balancing said magnetic receiver coil to an output of about zero when the magnetic field of the magnetic transmitter means is undistorted.

6. The apparatus of claim 5, wherein said auxiliary means comprise an auxiliary transmitter coil (H) for generating said auxiliary magnetic field.

7. The apparatus of claim 1, further comprising means for shielding said magnetic receiver coil, said shielding means comprising magnetic shunt means and shielding sheet metal elements operatively arranged for shielding said magnetic receiver coil against disturbing fields having a frequency lower than the frequency of said alternating current.

8. The apparatus of cliam 1, wherein said relative movement represents a change in a gap between said magnetically levitated vehicle and said rail of magnetically conducting material.

9. The apparatus of claim 1, wherein said relative movement represents a distance travelled by said magnetically levitated vehicle along said rail of magnetically conducting material.

10. The apparatus of claim 1, wherein said preferred receiver coil and said preferred transmitter coil axies are arranged in parallel to each other.

11. The apparatus of claim 1, wherein said preferred receiver coil and said preferred transmitter coil axes are arranged in longitudinal axial alignment with each other.

* * * * *